United States Patent
Ahn et al.

(10) Patent No.: US 7,999,334 B2
(45) Date of Patent: Aug. 16, 2011

(54) HAFNIUM TANTALUM TITANIUM OXIDE FILMS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/563,596

(22) Filed: Sep. 21, 2009

(65) Prior Publication Data

US 2010/0006918 A1  Jan. 14, 2010

Related U.S. Application Data

(62) Division of application No. 11/297,741, filed on Dec. 8, 2005, now Pat. No. 7,592,251.

(51) Int. Cl.
*H01L 21/02* (2006.01)
*H01L 27/108* (2006.01)
*H01L 29/94* (2006.01)
*H01L 29/788* (2006.01)

(52) U.S. Cl. ........ 257/410; 257/310; 257/316; 257/532; 257/E29.165

(58) Field of Classification Search .......... None
See application file for complete search history.

(56) References Cited

U.S. PATENT DOCUMENTS

| | | | |
|---|---|---|---|
| 5,057,447 A | 10/1991 | Paterson | |
| 5,100,825 A | 3/1992 | Fazan et al. | |
| 5,504,022 A | 4/1996 | Nakanishi et al. | |
| 6,010,969 A | 1/2000 | Vaartstra | |
| 6,063,705 A | 5/2000 | Vaartstra | |
| 6,217,645 B1 | 4/2001 | Vaartstra | |
| 6,225,163 B1 | 5/2001 | Bergemont | |
| 6,225,237 B1 | 5/2001 | Vaartstra | |
| 6,273,951 B1 | 8/2001 | Vaartstra | |
| 6,310,376 B1 | 10/2001 | Ueda et al. | |
| 6,329,286 B1 | 12/2001 | Vaartstra | |
| 6,368,398 B2 | 4/2002 | Vaartstra | |
| 6,368,518 B1 | 4/2002 | Vaartstra | |
| 6,396,099 B2 | 5/2002 | Joo et al. | |
| 6,426,292 B2 | 7/2002 | Vaartstra | |
| 6,441,421 B1 | 8/2002 | Clevenger et al. | |
| 6,445,023 B1 | 9/2002 | Vaartstra et al. | |
| 6,455,717 B1 | 9/2002 | Vaartstra | |
| 6,511,873 B2 | 1/2003 | Ballantine et al. | |
| 6,562,491 B1 | 5/2003 | Jeon | |
| 6,563,160 B2 | 5/2003 | Clevenger et al. | |
| 6,613,695 B2 | 9/2003 | Pomarede et al. | |
| 6,617,639 B1 | 9/2003 | Wang et al. | |
| 6,642,573 B1 | 11/2003 | Halliyal et al. | |
| 6,660,578 B1 | 12/2003 | Karlsson et al. | |

(Continued)

OTHER PUBLICATIONS

Lu et al. Electrical Properties of Amorphous High-K HfTaTiO Gate Dielectric With Dielectric Constants of 40-60. May 2005. IEEE Electron Device Letters. vol. 26. No. 5. pp. 298-300.*

(Continued)

*Primary Examiner* — Hoang-Quan T Ho
(74) *Attorney, Agent, or Firm* — Schwegman, Lundberg & Woessner, P.A.

(57) ABSTRACT

Embodiments of a dielectric layer containing a hafnium tantalum titanium oxide film structured as one or more monolayers include the dielectric layer disposed in an integrated circuit. Embodiments of methods of fabricating such a dielectric layer provide a dielectric layer for use in a variety of electronic devices. An embodiment may include forming hafnium tantalum titanium oxide film using atomic layer deposition.

25 Claims, 3 Drawing Sheets

U.S. PATENT DOCUMENTS

| | | |
|---|---|---|
| 6,682,602 B2 | 1/2004 | Vaartstra |
| 6,706,115 B2 | 3/2004 | Leskela et al. |
| 6,727,169 B1 | 4/2004 | Raaijmakers et al. |
| 6,730,163 B2 | 5/2004 | Vaartstra |
| 6,730,164 B2 | 5/2004 | Vaartstra et al. |
| 6,784,049 B2 | 8/2004 | Vaartstra |
| 6,784,101 B1 | 8/2004 | Yu et al. |
| 6,787,421 B2 | 9/2004 | Gilmer et al. |
| 6,790,755 B2 | 9/2004 | Jeon |
| 6,794,284 B2 | 9/2004 | Vaartstra |
| 6,806,211 B2 | 10/2004 | Shinriki et al. |
| 6,821,563 B2 | 11/2004 | Yudovsky |
| 6,844,604 B2 | 1/2005 | Lee et al. |
| 6,863,725 B2 | 3/2005 | Vaartstra et al. |
| 6,863,727 B1 | 3/2005 | Elers et al. |
| 6,949,433 B1 | 9/2005 | Hidehiko et al. |
| 6,958,300 B2 | 10/2005 | Vaartstra et al. |
| 6,967,159 B2 | 11/2005 | Vaartstra |
| 6,984,591 B1 | 1/2006 | Buchanan et al. |
| 6,984,592 B2 | 1/2006 | Vaartstra |
| 6,995,081 B2 | 2/2006 | Vaartstra |
| 7,005,697 B2 | 2/2006 | Batra et al. |
| 7,019,351 B2 | 3/2006 | Eppich et al. |
| 7,030,042 B2 | 4/2006 | Vaartstra et al. |
| 7,041,609 B2 | 5/2006 | Vaartstra |
| 7,045,406 B2 | 5/2006 | Huotari et al. |
| 7,057,244 B2 | 6/2006 | Andreoni et al. |
| 7,077,902 B2 | 7/2006 | Vaartstra |
| 7,087,481 B2 | 8/2006 | Vaartstra et al. |
| 7,112,485 B2 | 9/2006 | Vaartstra |
| 7,115,166 B2 | 10/2006 | Vaartstra et al. |
| 7,115,528 B2 | 10/2006 | Vaartstra et al. |
| 7,115,566 B2 | 10/2006 | Vaartstra et al. |
| 7,122,464 B2 | 10/2006 | Vaartstra |
| 7,125,815 B2 | 10/2006 | Vaartstra |
| 7,141,278 B2 | 11/2006 | Koh et al. |
| 7,196,007 B2 | 3/2007 | Vaartstra |
| 7,250,367 B2 | 7/2007 | Vaartstra et al. |
| 7,253,122 B2 | 8/2007 | Vaartstra |
| 7,271,077 B2 | 9/2007 | Vaartstra et al. |
| 7,294,556 B2 | 11/2007 | Vaartstra |
| 7,300,870 B2 | 11/2007 | Vaartstra |
| 7,332,442 B2 | 2/2008 | Vaartstra et al. |
| 7,368,402 B2 | 5/2008 | Vaartstra |
| 7,374,617 B2 | 5/2008 | Vaartstra |
| 7,399,675 B2 | 7/2008 | Chindalore et al. |
| 7,410,918 B2 | 8/2008 | Vaartstra |
| 7,560,395 B2 | 7/2009 | Ahn |
| 7,595,528 B2 | 9/2009 | Duan et al. |
| 7,601,649 B2 | 10/2009 | Ahn et al. |
| 7,602,030 B2 | 10/2009 | Ahn et al. |
| 7,605,030 B2 | 10/2009 | Forbes et al. |
| 7,611,959 B2 | 11/2009 | Ahn et al. |
| 7,615,438 B2 | 11/2009 | Ahn et al. |
| 7,625,794 B2 | 12/2009 | Ahn et al. |
| 7,662,729 B2 | 2/2010 | Ahn et al. |
| 7,670,646 B2 | 3/2010 | Ahn et al. |
| 7,687,409 B2 | 3/2010 | Ahn et al. |
| 7,700,989 B2 | 4/2010 | Ahn et al. |
| 7,719,065 B2 | 5/2010 | Ahn et al. |
| 7,727,905 B2 | 6/2010 | Ahn et al. |
| 7,776,762 B2 | 8/2010 | Ahn et al. |
| 7,863,667 B2 | 1/2011 | Kie et al. |
| 7,915,174 B2 | 3/2011 | Kie et al. |
| 2001/0042505 A1 | 11/2001 | Vaartstra |
| 2003/0040196 A1 | 2/2003 | Lim et al. |
| 2003/0143801 A1 | 7/2003 | Basceri et al. |
| 2003/0176065 A1 | 9/2003 | Vaartstra |
| 2003/0200917 A1 | 10/2003 | Vaartstra |
| 2003/0213987 A1 | 11/2003 | Basceri |
| 2004/0040494 A1 | 3/2004 | Vaartstra et al. |
| 2004/0040501 A1 | 3/2004 | Vaartstra |
| 2004/0043151 A1 | 3/2004 | Vaartstra |
| 2004/0043600 A1 | 3/2004 | Vaartstra |
| 2004/0043604 A1 | 3/2004 | Vaartstra |
| 2004/0043625 A1 | 3/2004 | Vaartstra et al. |
| 2004/0043630 A1 | 3/2004 | Vaartstra et al. |
| 2004/0043632 A1 | 3/2004 | Vaartstra |
| 2004/0043633 A1 | 3/2004 | Vaartstra |
| 2004/0043634 A1 | 3/2004 | Vaartstra |
| 2004/0043635 A1 | 3/2004 | Vaartstra |
| 2004/0043636 A1 | 3/2004 | Vaartstra et al. |
| 2004/0077177 A1 | 4/2004 | Andreoni et al. |
| 2004/0092073 A1 | 5/2004 | Cabral, Jr. et al. |
| 2004/0115883 A1 | 6/2004 | Iwata et al. |
| 2004/0126954 A1 | 7/2004 | Vaartstra et al. |
| 2004/0152254 A1 | 8/2004 | Vaartstra et al. |
| 2004/0187968 A1 | 9/2004 | Vaartstra |
| 2004/0197946 A1 | 10/2004 | Vaartstra et al. |
| 2004/0219746 A1 | 11/2004 | Vaartstra et al. |
| 2004/0224468 A1 | 11/2004 | Hwang |
| 2005/0009266 A1 | 1/2005 | Vaartstra |
| 2005/0009368 A1 | 1/2005 | Vaartstra |
| 2005/0019978 A1 | 1/2005 | Vaartstra et al. |
| 2005/0028733 A1 | 2/2005 | Vaartstra |
| 2005/0032360 A1 | 2/2005 | Vaartstra |
| 2005/0054149 A1 | 3/2005 | Xiang et al. |
| 2005/0124171 A1 | 6/2005 | Vaartstra |
| 2005/0136689 A9 | 6/2005 | Vaartstra |
| 2005/0151184 A1 | 7/2005 | Lee et al. |
| 2005/0156256 A1 | 7/2005 | Kim et al. |
| 2005/0160981 A9 | 7/2005 | Vaartstra et al. |
| 2005/0173755 A1 | 8/2005 | Forbes |
| 2005/0202659 A1* | 9/2005 | Li et al. .......... 438/533 |
| 2005/0221006 A1 | 10/2005 | Vaartstra |
| 2005/0287804 A1 | 12/2005 | Vaartstra |
| 2005/0287819 A1 | 12/2005 | Vaartstra et al. |
| 2006/0027882 A1 | 2/2006 | Mokhlesi |
| 2006/0046521 A1 | 3/2006 | Vaartstra et al. |
| 2006/0048711 A1 | 3/2006 | Vaartstra |
| 2006/0081895 A1 | 4/2006 | Lee et al. |
| 2006/0125026 A1* | 6/2006 | Li et al. .......... 257/410 |
| 2006/0148180 A1 | 7/2006 | Ahn et al. |
| 2006/0172485 A1 | 8/2006 | Vaartstra |
| 2006/0231017 A1 | 10/2006 | Vaartstra |
| 2006/0252244 A1 | 11/2006 | Vaartstra et al. |
| 2006/0252279 A1 | 11/2006 | Vaartstra |
| 2006/0258175 A1 | 11/2006 | Vaartstra et al. |
| 2006/0261389 A1 | 11/2006 | Vaartstra |
| 2006/0264066 A1 | 11/2006 | Bartholomew et al. |
| 2006/0292788 A1 | 12/2006 | Vaartstra |
| 2007/0006798 A1 | 1/2007 | Vaartstra et al. |
| 2007/0010060 A1 | 1/2007 | Forbes et al. |
| 2007/0020856 A1 | 1/2007 | Sadd et al. |
| 2007/0049054 A1 | 3/2007 | Ahn et al. |
| 2007/0144438 A1 | 6/2007 | Vaartstra |
| 2007/0155190 A1 | 7/2007 | Vaartstra et al. |
| 2007/0161260 A1 | 7/2007 | Vaartstra |
| 2007/0166999 A1 | 7/2007 | Vaartstra |
| 2007/0181931 A1 | 8/2007 | Ahn et al. |
| 2007/0295273 A1 | 12/2007 | Vaartstra |
| 2008/0064210 A1 | 3/2008 | Vaartstra |
| 2008/0102629 A1 | 5/2008 | Vaartstra |
| 2008/0193791 A1 | 8/2008 | Ahn et al. |
| 2008/0220618 A1 | 9/2008 | Ahn et al. |
| 2009/0032910 A1 | 2/2009 | Ahn et al. |
| 2010/0029054 A1 | 2/2010 | Ahn et al. |
| 2010/0044771 A1 | 2/2010 | Ahn et al. |
| 2010/0052033 A1 | 3/2010 | Ahn et al. |
| 2010/0176442 A1 | 7/2010 | Ahn et al. |
| 2010/0224944 A1 | 9/2010 | Ahn et al. |
| 2010/0301406 A1 | 12/2010 | Ahn et al. |

OTHER PUBLICATIONS

Lu et al. Higher K HfTaTiO gate dielectric with improved material and electrical characteristics. Jun. 22, 2005. Device Research Conference Digiest, 2005. DRC '05. 63rd. pp. 221-222.*

Lu et al. Improved Device Performance and Reliability in High K HfTaTiO Gate Dielectric With TaN Gate Electrode. Nov. 2005. IEEE Electron Device Letters. vol. 26. No. 11. pp. 790-792.*

Aarik, Jaan, "Atomic layer growth of epitaxial $TiO_2$ thin films from $TiCl_4$ and $H_2O$ on $Al_2O_3$ substrates", *Journal of Crystal Growth*, 242(1-2), (2002), 189-198.

Chen, F., "A study of mixtures of $HfO_2$ and $TiO_2$ as high-k gate dielectrics", *Microelectronic Engineering 72*, (2004), 263.

Choi, Rino, et al., "High-Quality Ultra-thin HfO$_2$ Gate Dielectric MOSFETs with TaN Electrode and Nitridation Surface Properties", *2001 Symposium on VLSI Technology Digest of Technical Papers*, (2001), 15-16.

Fang, Q., et al., "Investigation of TiO$_2$-dp[ed HfO$_2$ thin films deposited by photo-CVD", *Thin Solid Films 428*, (2003), 263-268.

Kukli, Kaupo, "Atomic Layer Epitaxy Growth of Tantalum Oxide Thin Films from Ta(OC$_2$H$_5$)$_5$ and H$_2$O", *J. Electrochem. Soc.*, vol. 142, No. 5, (May 1995), 1670-1675.

Kukli, Kaupo, "Tailoring the dielectric properties of HfO$_2$-Ta$_2$O$_3$ nanolaminates", *Appl. Phys. Lett.*, 68, (1996), 3737-3739.

Lee, S. J., et al., "Performance and Reliability of Ultra Thin CVD HfO$_2$ Gate Dielectrics with Dual Poly-Si Gate Electrodes", *2001 Symposium on VLSI Technology*, (2001), 133-134.

Lu, N., et al., "Electrical Properties of Amorphous High-k HfTaTiO Gate Dielectric With Dielectric Constants of 40-60", *IEEE Electron Device Letters*, vol. 26, No. 5, (May 2005), 298-300.

Sneh, Ofer, "Thin film atomic layer deposition equipment for semiconductor processing", *Thin Solid Films*, 402(1-2), Preparation and Characterization, Elsevier Sequoia, NL, vol. 402, No. 1-2, (2002), 248-261.

Yu, Xiongfei, et al., "High Mobility and Excellent Electrical Stability of MOSFETs Using a Novel HfTaO Gate Dielectric", *2004 Symposium on VLSI Technology Digest of Technical Papers*, (Jun. 15-17, 2004), 110-111.

Zhang, H, et al., "High permitivity thin film nanolaminates", *Journal of Applied Physics*, 87(4), (Feb. 2000), 1921-1924.

Conley, J. F, "Atomic Layer Deposition of Hafnium Oxide Using Anhydrous Hafnium Nitrate", Electrochemical and Solid-State Letters, 5(5), (May 2002), C57-C59.

Duenas, et al., "Interface Quality of High-Pressure Reactive Sputterd and Atomic Layer Deposited Titanium oxide Thin Films on Silicon", IEEE Transaction, Spanish Conference on Electronic Devices, (Feb. 2-4, 2005), 49-52.

Jones, A. J, et al., "Some recent developments in the MOCVD and ALD of high k dielectric oxides", J. of Materials Chemistry, par. 3.2, (Sep. 2004), 3109.

Lee, S. J., et al., "Performance and Reliability of Ultra Thin CVD HfO2 Gate Dielectrics with Dual Poly-Si Gate Electrodes", 2001 Symposium on VLSI Technology, (2001), 133-134.

Puurunen, Riikka L, "Surface chemistry of atomic layer deposition: A case study for the trimethylaluminum/water process", J. Appl. Phys. 97, (2005), 121301 (52 pgs.).

Somorjai, "Introduction to surface chemistry and catalysis", (1994), 336-337.

\* cited by examiner

HAFNIUM TANTALUM TITANIUM OXIDE FILMS

RELATED APPLICATION

This application is a Divisional of U.S. application Ser. No. 11/297,741, filed Dec. 8, 2005, now U.S. Pat. No. 7,592,251 which is incorporated herein its entirety by reference.

TECHNICAL FIELD

This application relates generally to semiconductor devices and device fabrication.

BACKGROUND

The semiconductor device industry has a market driven need to reduce the size of devices used in products such as processor chips, mobile telephones, and memory devices such as dynamic random access memories (DRAMs). Currently, the semiconductor industry relies on the ability to reduce or scale the dimensions of its basic devices. This device scaling includes scaling dielectric layers in devices such as, for example, capacitors and silicon based metal oxide semiconductor field effect transistors (MOSFETs) and variations thereof, which have primarily been fabricated using silicon dioxide. A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created the need to use other materials as dielectric regions in a variety of electronic structures.

DETAILED DESCRIPTION

Figure 1:
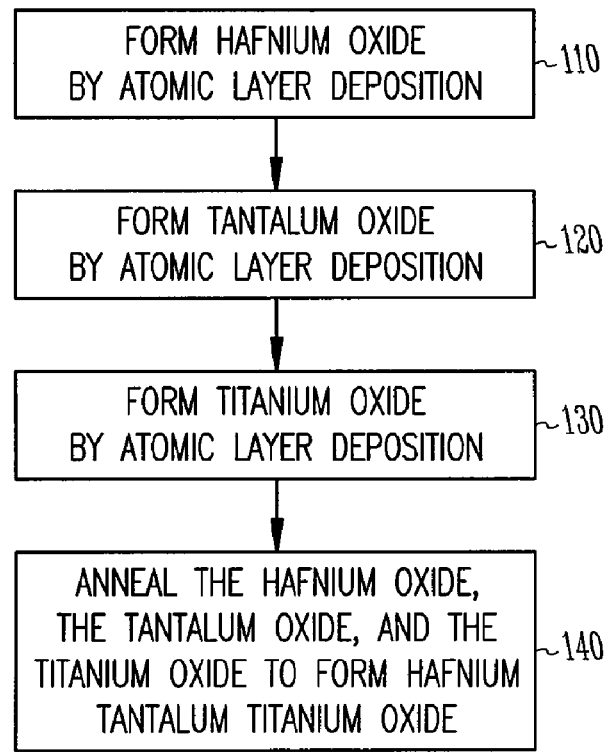
FIG. 1 illustrates features for an embodiment of a method to form a hafnium tantalum titanium oxide film using atomic layer deposition.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure. The term substrate is understood to include a semiconductor wafer. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors, and the term insulator or dielectric is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

To scale a dielectric region to minimize feature sizes to provide high density electronic devices, the dielectric region typically should have a reduced equivalent oxide thickness ($t_{eq}$). The equivalent oxide thickness quantifies the electrical properties, such as capacitance, of the dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface will have a $t_{eq}$ larger than its thickness, t. This $t_{eq}$ results from the capacitance in the surface on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale a gate dielectric equivalent oxide thickness to less than 10 Å, the physical thickness requirement for a $SiO_2$ layer used for a gate dielectric may need to be approximately 4 to 7 Å. Additional requirements on a $SiO_2$ layer would depend on the electrode used in conjunction with the $SiO_2$ dielectric. Using a conventional polysilicon electrode may result in an additional increase in $t_{eq}$ for the $SiO_2$ layer. This additional thickness may be eliminated by using a metal electrode, though such metal electrodes are not universally used for all devices. Thus, future devices would be designed towards a physical $SiO_2$ dielectric layer of about 5 Å or less. Such a small thickness requirement for a $SiO_2$ oxide layer creates additional problems.

Silicon dioxide is used as a dielectric layer in devices, in part, due to its electrical isolation properties in a $SiO_2$—Si based structure. This electrical isolation is due to the relatively large band gap of $SiO_2$ (8.9 eV), making it a good insulator from electrical conduction. Significant reductions in its band gap may eliminate it as a material for a dielectric region in an electronic device. As the thickness of a $SiO_2$ layer decreases, the number of atomic layers, or monolayers of the material decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers may not form a full band gap. The lack of a full band gap in a $SiO_2$ dielectric may cause an effective short between an underlying Si electrode and an overlying polysilicon electrode. This undesirable property sets a limit on the physical thickness to which a $SiO_2$ layer can be scaled. The minimum thickness due to this monolayer effect is thought to be about 7-8 Å. Therefore, for future devices to have a $t_{eq}$ less than about 10 Å, other dielectrics than $SiO_2$ need to be considered for use as a dielectric region in such future devices.

In many cases, for a typical dielectric layer, the capacitance is determined as a capacitance for a parallel plate capacitor: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox}=3.9$, as $$t=(\kappa/\kappa_{ox})t_{eq}=(\kappa/3.9)t_{eq}.$$

Thus, materials with a dielectric constant greater than that of $SiO_2$ will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than $SiO_2$.

The thinner equivalent oxide thickness required for lower device operating voltages and smaller device dimensions may be realized by a significant number of materials, but additional fabricating requirements make determining a suitable replacement for $SiO_2$ difficult. The current view for the microelectronics industry is still for Si based devices. This may require that the dielectric material employed be grown on a silicon substrate or a silicon layer, which places significant constraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness, t, of the dielectric being formed, written as $$t_{eq}=t_{SiO_2}+(\kappa_{ox}/\kappa)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer should provide a high quality interface.

One of the advantages of using $SiO_2$ as a dielectric layer in a device has been that the formation of the $SiO_2$ layer results in an amorphous dielectric. Having an amorphous structure for a dielectric may reduce problems of leakage current associated with grain boundaries in polycrystalline dielectrics that provide high leakage paths. Additionally, grain size and orientation changes throughout a polycrystalline dielectric can cause variations in the film's dielectric constant, along with uniformity and surface topography problems. Typically, materials having a high dielectric constant relative to $SiO_2$ also have a crystalline form, at least in a bulk configuration.

The best candidates for replacing $SiO_2$ as a dielectric in a device are those that can be fabricated as a thin layer with an amorphous form and that have high dielectric constants.

In an embodiment, a hafnium tantalum titanium oxide dielectric film may be formed using atomic layer deposition (ALD). Forming such a dielectric film using atomic layer deposition may allow control of transitions between material layers. As a result of such control, atomic layer deposited hafnium tantalum titanium oxide dielectric films can have an engineered transition with a substrate surface. Embodiments include structures for capacitors, transistors, memory devices, and electronic systems with a hafnium tantalum titanium oxide film structured as one or more monolayers, and methods for forming such structures.

ALD, also known as atomic layer epitaxy (ALE), is a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber may be purged with a gas, where the purging gas may be an inert gas. Between the pulses, the reaction chamber may be evacuated. Between the pulses, the reaction chamber may be purged with a gas and evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other aggressively on the substrate, one ALD cycle can be performed in less than one second in properly designed flow type reaction chambers. Typically, precursor pulse times range from about 0.5 sec to about 2 to 3 seconds. Pulse times for purging gases may be significantly longer, for example, pulse times of about 5 to about 30 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Atomic layer deposition provides control of film thickness in a straightforward manner by controlling the number of growth cycles.

The precursors used in an ALD process may be gaseous, liquid or solid. However, liquid or solid precursors should be volatile. The vapor pressure should be high enough for effective mass transportation. Also, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may vary somewhat during the process because of changes in their surface area.

There are several other characteristics for precursors used in ALD. The precursors should be thermally stable at the substrate temperature, because their decomposition may destroy the surface control and accordingly the advantages of the ALD method that relies on the reaction of the precursor at the substrate surface. A slight decomposition, if slow compared to the ALD growth, may be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction should be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. A metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that may all be identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle may be realized.

Processing by RS-ALD provides continuity at an interface avoiding poorly defined nucleating regions that are typical for chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with a resolution of one to two monolayers. RS-ALD processes allow for deposition control on the order of monolayers and the ability to deposit monolayers of amorphous films.

Herein, a sequence refers to the ALD material formation based on an ALD reaction of a precursor with its reactant precursor. For example, forming tantalum oxide from a $TaCl_5$ precursor and water vapor, as its reactant precursor, forms an embodiment of a tantalum/oxygen sequence, which can also be referred to as a tantalum sequence. In various ALD processes that form an oxide or a compound that contains oxygen, a reactant precursor that contains oxygen is used to supply oxygen. Herein, a precursor that contains oxygen and that supplies oxygen to be incorporated in the ALD compound formed, which may be used in an ALD process with precursors supplying the other elements in the ALD compound, is referred to as an oxygen reactant precursor. In the above example, water vapor is an oxygen reactant precursor. An ALD cycle may include pulsing a precursor, pulsing a purging gas for the precursor, pulsing a reactant precursor, and pulsing the reactant precursor's purging gas. Further, in forming a layer of a metal species, an ALD sequence may deal with reacting a precursor containing the metal species with a substrate surface. A cycle for such a metal forming sequence may include pulsing a purging gas after pulsing the precursor containing the metal species to deposit the metal. Additionally, deposition of a semiconductor material may be realized in a manner similar to forming a layer of a metal, given the appropriate precursors for the semiconductor material.

In an ALD formation of a compound having more than two elements, a cycle may include a number of sequences to provide the elements of the compound. For example, a cycle for an ALD formation of an $ABO_x$ compound may include sequentially pulsing a first precursor/a purging gas for the first precursor/a first reactant precursor/the first reactant precursor's purging gas/a second precursor/a purging gas for the second precursor/a second reactant precursor/the second reactant precursor's purging gas, which may be viewed as a cycle having two sequences. In an embodiment, a cycle may include a number of sequences for element A and a different number of sequences for element B. There may be cases in which ALD formation of an $ABO_x$ compound uses one precursor that contains the elements A and B, such that pulsing the AB containing precursor followed by its reactant precursor onto a substrate may include a reaction that forms $ABO_x$ on the substrate to provide an AB/oxygen sequence. A cycle of an AB/oxygen sequence may include pulsing a precursor containing A and B, pulsing a purging gas for the precursor, pulsing an oxygen reactant precursor to the A/B precursor, and pulsing a purging gas for the reactant precursor. A cycle may be repeated a number of times to provide a desired thickness of the compound. In an embodiment, a cycle for an ALD formation of the quaternary compound, hafnium tantalum titanium oxide, may include sequentially pulsing a first precursor/a purging gas for the first precursor/a first reactant precursor/the first reactant precursor's purging gas/a second precursor/a purging gas for the second precursor/a second reactant precursor/the second reactant precursor's purging gas/a third precursor/a purging gas for the third precursor/a third reactant precursor/the third reactant precursor's purging gas, which may be viewed as a cycle having three sequences. In an embodiment, a layer substantially of a hafnium tantalum titanium oxide compound is formed on a substrate mounted in a reaction chamber using ALD in repetitive hafnium, tantalum, and titanium sequences using precursor gases individually pulsed into the reaction chamber. Alternatively, solid or liquid precursors can be used in an appropriately designed reaction chamber.

In an embodiment, a hafnium tantalum titanium oxide layer may be structured as one or more monolayers. A film of hafnium tantalum titanium oxide, structured as one or more monolayers, may have a thickness that ranges from a monolayer to thousands of angstroms. The film may be processed using atomic layer deposition. Embodiments of an atomic layer deposited hafnium tantalum titanium oxide layer have a larger dielectric constant than silicon dioxide. Such dielectric layers provide a significantly thinner equivalent oxide thickness compared with a silicon oxide layer having the same physical thickness. Alternatively, such dielectric layers provide a significantly thicker physical thickness than a silicon oxide layer having the same equivalent oxide thickness. This increased physical thickness aids in reducing leakage current.

The term hafnium tantalum titanium oxide is used herein with respect to a compound that essentially consists of hafnium, tantalum, titanium, and oxygen in a form that may be stoichiometric, non-stoichiometric, or a combination of stoichiometric and non-stoichiometric. In an embodiment, hafnium tantalum titanium oxide may be formed substantially as stoichiometric hafnium tantalum titanium oxide. In an embodiment, hafnium tantalum titanium oxide may be formed substantially as a non-stoichiometric hafnium tantalum titanium oxide. In an embodiment, hafnium tantalum titanium oxide may be formed substantially as a combination of non-stoichiometric hafnium tantalum titanium oxide and stoichiometric hafnium tantalum titanium oxide. Herein, a hafnium tantalum titanium oxide compound may be expressed as HfTaTiO, HfTaTiO$_x$, Hf$_x$Ta$_y$Ti$_z$O$_r$, or other equivalent form. The expression HfTaTiO or its equivalent forms may be used to include a stoichiometric hafnium tantalum titanium oxide. The expression HfTaTiO or its equivalent forms may be used to include a non-stoichiometric hafnium tantalum titanium oxide. The expression HfTaTiO or its equivalent forms may be used to include a combination of a stoichiometric hafnium tantalum titanium oxide and a non-stoichiometric hafnium tantalum titanium oxide. The expression HfO$_x$ may be used to include a stoichiometric hafnium oxide. The expression HfO$_x$ may be used to include a non-stoichiometric hafnium oxide. The expression HfO$_x$ may be used to include a combination of a stoichiometric hafnium oxide and a non-stoichiometric hafnium oxide. Expressions TaO$_y$ and TiO$_r$ may be used in the same manner as HfO$_x$. In various embodiments, a hafnium tantalum titanium oxide film may be doped with elements or compounds other than hafnium, tantalum, titanium, and oxygen.

In an embodiment, a HfTaTiO$_x$ film may be structured as one or more monolayers. In an embodiment, the HfTaTiO$_x$ film may be constructed using atomic layer deposition. Prior to forming the HfTaTiO$_x$ film using ALD, the surface on which the HfTaTiO$_x$ film is to be deposited may undergo a preparation stage. The surface may be the surface of a substrate for an integrated circuit. In an embodiment, the substrate used for forming a transistor may include a silicon or silicon containing material. In other embodiments, germanium, gallium arsenide, silicon-on-sapphire substrates, or other suitable substrates may be used. A preparation process may include cleaning the substrate and forming layers and regions of the substrate, such as drains and sources, prior to forming a gate dielectric in the formation of a metal oxide semiconductor (MOS) transistor. Alternatively, active regions may be formed after forming the dielectric layer, depending on the over-all fabrication process implemented. In an embodiment, the substrate is cleaned to provide an initial substrate depleted of its native oxide. In an embodiment, the initial substrate is cleaned also to provide a hydrogen-terminated surface. In an embodiment, a silicon substrate undergoes a final hydrofluoric (HF) rinse prior to ALD processing to provide the silicon substrate with a hydrogen-terminated surface without a native silicon oxide layer.

Cleaning immediately preceding atomic layer deposition aids in reducing an occurrence of silicon oxide as an interface between a silicon based substrate and a hafnium tantalum titanium oxide dielectric formed using the atomic layer deposition process. The material composition of an interface layer and its properties are typically dependent on process conditions and the condition of the substrate before forming the dielectric layer. Though the existence of an interface layer may effectively reduce the dielectric constant associated with the dielectric layer and its substrate interface layer, a SiO$_2$ interface layer or other composition interface layer may improve the interface density, fixed charge density, and channel mobility of a device having this interface layer.

The sequencing of the formation of the regions of an electronic device, such as a transistor, being processed may follow typical sequencing that is generally performed in the fabrication of such devices as is well known to those skilled in the art. Included in the processing prior to forming a dielectric may be the masking of substrate regions to be protected during the dielectric formation, as is typically performed in semiconductor fabrication. In an embodiment, the unmasked region includes a body region of a transistor; however, one skilled in the art will recognize that other semiconductor device structures may utilize this process.

FIG. 1 illustrates features of an embodiment of a method to form a hafnium tantalum titanium oxide film using atomic layer deposition. The individual features labeled 110, 120, 130, and 140 may be performed in various orders. Between each pulsing of a precursor used in an atomic layer deposition process, a purging gas may be pulsed into the ALD reaction chamber. Between each pulsing of a precursor, the ALD reactor chamber may be evacuated using vacuum techniques as is known by those skilled in the art. Between each pulsing of a precursor, a purging gas may be pulsed into the ALD reaction chamber and the ALD reactor chamber may be evacuated.

At 110, hafnium oxide may be formed by atomic layer deposition. A hafnium-containing precursor is pulsed onto a substrate in an ALD reaction chamber. A number of precursors containing hafnium may be used to provide the hafnium to a substrate for an integrated circuit. In an embodiment, a precursor containing hafnium may include anhydrous hafnium nitride, Hf(NO$_3$)$_4$. In an embodiment using a Hf(NO$_3$)$_4$ precursor on a hydrogen-terminated silicon, the substrate temperature may be maintained at a temperature ranging from about 160° C. to about 180° C. In an embodiment, a hafnium precursor may include HfCl$_4$. In an embodiment using a HfCl$_4$ precursor, the substrate temperature may be maintained at a temperature ranging from about 180° C. to about 600° C. In an embodiment using a HfCl$_4$ precursor, the substrate temperature may be maintained at a temperature ranging from about 300° C. to about 940° C. In an embodiment, a hafnium precursor used may be HfI$_4$. In an embodiment using a HfI$_4$ precursor, the substrate temperature may be maintained at a temperature of about 300° C. In various embodiments, after pulsing the hafnium-containing precursor and purging the reaction chamber of excess precursor and by-products from pulsing the precursor, a reactant precursor may be pulsed into the reaction chamber. The reactant precursor may be an oxygen reactant precursor including, but not limited to, one or more of water vapor, atomic oxygen, molecular oxygen, ozone, hydrogen peroxide, a water—hydrogen peroxide mixture, alcohol, or nitrous oxide. In various embodiments, use of the individual hafnium-containing precursors is not limited to the temperature ranges of the above embodiments. In addition, the pulsing of the hafnium precursor may use a pulsing period that provides uniform coverage of a monolayer on the surface or may use a pulsing period that provides partial coverage of a monolayer on the surface during a hafnium sequence.

At 120, tantalum oxide may be formed by atomic layer deposition. A tantalum-containing precursor is pulsed to the substrate in the ALD reaction chamber. A number of precursors containing tantalum may be used to provide the tantalum to the substrate. In an embodiment, a precursor containing tantalum may include a tantalum ethoxide, Ta(OC$_2$H$_5$)$_5$, precursor. In an embodiment, during pulsing of the precursor containing tantalum, the substrate may be held between about 150° C. and about 450° C. In an embodiment, the substrate may be held between about 250° C. and about 325° C. In an embodiment, a tantalum halide such as TaCl$_5$ may be used as a precursor. In various embodiments, after pulsing the tantalum-containing precursor and purging the reaction chamber of excess precursor and by-products from pulsing the precursor, a reactant precursor may be pulsed into the reaction chamber. The reactant precursor may be an oxygen reactant precursor including, but not limited to, one or more of water vapor, atomic oxygen, molecular oxygen, ozone, hydrogen peroxide, a water-hydrogen peroxide mixture, alcohol, or nitrous oxide. In various embodiments, use of the individual tantalum-containing precursors is not limited to the temperature ranges of the above embodiments. In addition, the pulsing of the tantalum precursor may use a pulsing period that provides uniform coverage of a monolayer on the surface or may use a pulsing period that provides partial coverage of a monolayer on the surface during a tantalum sequence.

At 130, titanium oxide may be formed by atomic layer deposition. A titanium-containing precursor is pulsed to the substrate. A number of precursors containing titanium may be used to provide the titanium on the substrate. In an embodiment, the titanium-containing precursor may be $TiCl_4$. In an embodiment using a $TiCl_4$ precursor, the substrate temperature may be maintained at a temperature ranging from about 100° C. to about 500° C. In an embodiment using a $TiCl_4$ precursor, the substrate temperature may be maintained at a temperature of about 425° C. In an embodiment, a titanium precursor pulsed may be $TiI_4$. In an embodiment using a $TiI_4$ precursor, the substrate temperature may be maintained between about 230° C. and about 490° C. In an embodiment, a titanium precursor pulsed may be anhydrous $Ti(NO_3)_4$. In an embodiment using a $Ti(NO_3)_4$ precursor, the substrate temperature may be maintained at a temperature ranging from less than 250° C. to about 700° C. In an embodiment, a titanium precursor pulsed may be titanium isopropoxide, also written as $Ti(O^i$—$Pr)_4$. In an embodiment using a $Ti(O^i$—$Pr)_4$ precursor, the substrate temperature may be maintained at a temperature ranging from less than 250° C. to about 700° C. However, use of the individual titanium precursors is not limited to the temperature ranges of the above embodiments. In various embodiments, after pulsing the titanium-containing precursor and purging the reaction chamber of excess precursor and by-products from pulsing the precursor, a reactant precursor may be pulsed into the reaction chamber. The reactant precursor may be an oxygen reactant precursor including, but are not limited to, one or more of water vapor, atomic oxygen, molecular oxygen, ozone, hydrogen peroxide, a water—hydrogen peroxide mixture, alcohol, or nitrous oxide. In addition, the pulsing of the titanium precursor may use a pulsing period that provides uniform coverage of a monolayer on the surface or may use a pulsing period that provides partial coverage of a monolayer on the surface during a titanium sequence.

In various embodiments, nitrogen may be used as a purging gas and a carrier gas for one or more of the sequences used in the ALD formation of $HfO_x$, $TaO_y$, and $TiO_z$. Alternatively, hydrogen, argon gas, or other inert gases may be used as the purging gas. Excess precursor gas and reaction by-products may be removed by the purge gas. Excess precursor gas and reaction by-products may be removed by evacuation of the reaction chamber using various vacuum techniques. Excess precursor gas and reaction by-products may be removed by the purge gas and by evacuation of the reaction chamber.

Atomic layer deposition of the individual components or layers of $HfO_x$, $TaO_y$, and $TiO_z$ allows for individual control of each precursor pulsed into the reaction chamber. Thus, each precursor is pulsed into the reaction chamber for a predetermined period, where the predetermined period can be set separately for each precursor. Additionally, for various ALD formations, each precursor may be pulsed into the reaction chamber under separate environmental conditions. The substrate may be maintained at a selected temperature and the reaction chamber maintained at a selected pressure independently for pulsing each precursor. Appropriate temperatures and pressures may be maintained, whether the precursor is a single precursor or a mixture of precursors.

At 140, the hafnium oxide, the tantalum oxide, and the titanium oxide are annealed to form hafnium tantalum titanium oxide. In an embodiment, a laminated stack of alternating layers of $TiO_2$, $TaO_2$, and $HfO_2$ are formed prior to annealing. In various embodiments, the order of forming $TiO_x$, $TaO_x$, and $HfO_x$ layers may be permutated. The annealing may be conducted in a nitrogen ambient. In an embodiment, annealing may be conducted in a nitrogen ambient having a small amount of oxygen. In an embodiment, annealing may be performed by rapid thermal annealing (RTA) to form a $HfTaTiO_x$ film. In an embodiment, annealing may be conducted at a temperature ranging from about 600° C. to about 900° C. for a period of time ranging from about 10 seconds to about 30 seconds. However, annealing is not limited to these temperatures, periods, or ambient conditions.

In an embodiment, a layer of hafnium oxide, a layer of tantalum oxide, and a layer of titanium oxide are each grown by atomic layer deposition to a thickness such that annealing these layers at appropriate temperatures essentially converts these layers to a layer of hafnium tantalum titanium oxide. In an embodiment, each layer of $HfO_x$, $TaO_y$, and $TiO_z$ is formed to a thickness of 10 Å or less. In the various embodiments, the thickness of a hafnium tantalum titanium oxide film is related to the number of ALD cycles performed and the growth rate associated with forming each layer of $HfO_x$, $TaO_y$, and $TiO_z$. As can be understood by those skilled in the art, particular effective growth rates for the engineered hafnium tantalum titanium oxide film can be determined during normal initial testing of the ALD system used in processing a hafnium tantalum titanium oxide dielectric for a given application without undue experimentation.

In an embodiment, a HfTaTiO film may be grown to a desired thickness by repetition of a process including atomic layer deposition of layers of $HfO_x$, $TaO_y$, $TiO_z$ followed by annealing. In an embodiment, a base thickness may be formed according to various embodiments such that forming a predetermined thickness of a HfTaTiO film may be conducted by forming a number of layers having the base thickness. As can be understood by one skilled in the art, determining the base thickness depends on the application and can be determined during initial processing without undue experimentation. Relative amounts of hafnium, tantalum, and titanium in a HfTaTiO film may be controlled by regulating the relative thicknesses of the individual layers of $HfO_x$, $TaO_y$, $TiO_z$ formed. In addition, relative amounts of hafnium, tantalum, and titanium in a HfTaTiO film may be controlled by forming a layer of HfTaTiO as multiple layers of different base thickness and by regulating the relative thicknesses of the individual layers of $HfO_x$, $TaO_y$, and $TiO_z$ formed in each base layer.

In an alternative embodiment, an ALD cycle for forming HfTaTiO may include sequencing metal-containing precursors in the order of hafnium, tantalum, and titanium in which partial coverage of a monolayer on a substrate surface is attained for pulsing of a metal-containing precursor. An ALD cycle for forming HfTaTiO may include sequencing the metal-containing precursors in the order of hafnium, titanium, and tantalum; in the order: tantalum, titanium, and hafnium; in the order: tantalum, hafnium, and tantalum; in the order: titanium, tantalum, and hafnium; or in the order: titanium, hafnium, and tantalum. Oxygen reactant precursors may be applied after pulsing each metal-containing precursor or after pulsing all the metal-containing precursors. Embodiments for methods for forming hafnium tantalum titanium oxide film by atomic layer deposition may include numerous permutations of hafnium sequences, tantalum sequences, and titanium sequences for forming a hafnium tantalum titanium oxide film. In an embodiment, a hafnium/tantalum/titanium cycle may include a number, x, of hafnium sequences, a number, y, of tantalum sequences, and a number, z, of titanium sequences, in which reactant precursors associated with each metal are applied with the associated sequence. The number of sequences x, y, and z may be selected to engineer the relative amounts of hafnium, tantalum, and titanium. In an embodiment, the number of sequences x, y, and z are selected to form a hafnium-rich hafnium tantalum titanium oxide. Alternatively, the number of sequences x, y, and z are selected to form a tantalum-rich hafnium tantalum titanium oxide. Additionally, the number of sequences x, y, and z are selected to form a titanium-rich hafnium tantalum titanium oxide.

After repeating a selected number of ALD cycles, a determination may be made as to whether the number of hafnium/tantalum/titanium cycles equals a predetermined number to form the desired hafnium tantalum titanium oxide layer. If the total number of cycles to form the desired thickness has not been completed, a number of cycles for the hafnium, tantalum, and titanium sequences is repeated. The thickness of a hafnium tantalum titanium oxide layer formed by atomic layer deposition may be determined by a fixed growth rate for the pulsing periods and precursors used, set at a value such as N nm/cycle, dependent upon the number of cycles of the hafnium/tantalum/titanium sequences. Depending on the precursors used for ALD formation of a HfTaTiO film, the process may be conducted in an ALD window, which is a range of temperatures in which the growth rate is substantially constant. If such an ALD window is not available, the ALD process may be conducted at the same set of temperatures for each ALD sequence in the process. For a desired hafnium tantalum titanium oxide layer thickness, t, in an application, the ALD process is repeated for t/N total cycles. Once the t/N cycles have completed, no further ALD processing for the hafnium tantalum titanium oxide layer is required. A hafnium tantalum titanium oxide layer processed at relatively low temperatures associated with atomic layer deposition may provide an amorphous layer.

Either before or after forming a HfTaTiO film in accordance with any of the embodiments, other dielectric layers such as nitride layers, dielectric metal silicates, insulating metal oxides including $TaO_y$, $TiO_z$, $HfO_x$, and lanthanide oxides or combinations thereof may be formed as part of a dielectric layer or dielectric stack. These one or more other layers of dielectric material may be provided in stoichiometric form, in non-stoichiometric form, or a combination of stoichiometric dielectric material and non-stoichiometric dielectric material. Depending on the application, a dielectric stack containing a $HfTaTiO_x$ film may include a silicon oxide layer. In an embodiment, the dielectric layer may be formed as a nanolaminate. An embodiment of a nanolaminate may include a layer of a hafnium oxide and a $HfTaTiO_x$ film, a layer of tantalum oxide and a $HfTaTiO_x$ film, a layer of titanium oxide and a $HfTaTiO_x$ film, layers of hafnium oxide, tantalum oxide, and titanium oxide along with a $HfTaTiO_x$ film, or various other combinations. Alternatively, a dielectric layer may be formed substantially as the hafnium tantalum titanium oxide film.

In various embodiments, the structure of an interface between a dielectric layer and a substrate on which it is disposed is controlled to limit the inclusion of silicon oxide, since a silicon oxide layer would reduce the effective dielectric constant of the dielectric layer. The material composition and properties for an interface layer may be dependent on process conditions and the condition of the substrate before forming the dielectric layer. Though the existence of an interface layer may effectively reduce the dielectric constant associated with the dielectric layer and its substrate, the interface layer, such as a silicon oxide interface layer or other composition interface layer, may improve the interface density, fixed charge density, and channel mobility of a device having this interface layer.

In an embodiment, the hafnium tantalum titanium oxide layer may be doped with other metals. The doping may be employed to enhance the leakage current characteristics of the dielectric layer containing the $HfTaTiO_x$ film by providing a disruption or perturbation of the hafnium tantalum titanium oxide structure. Such doping may be realized by substituting a sequence of one of these metals for a hafnium sequence, a tantalum sequence, a titanium sequence, or various combinations of sequences. The choice for substitution may depend on the form of the hafnium tantalum titanium oxide structure with respect to the relative amounts of hafnium atoms, tantalum atoms, and titanium atoms desired in the oxide. To maintain a substantially hafnium tantalum titanium oxide, the amount of dopants inserted into the oxide may be limited to a relatively small fraction of the total number of hafnium, titanium, and tantalum atoms.

In an embodiment, a $HfTaTiO_x$ film may be engineered to have a dielectric constant, the value of which lies in the range from about 25 to about 80. In an embodiment, a $HfTaTiO_x$ film may be engineered to provide a hafnium tantalum titanium oxide film having a dielectric constant between 40 and 60. In an embodiment, a dielectric layer containing a hafnium tantalum titanium oxide layer may have a $t_{eq}$ ranging from about 5 Å to about 20 Å. In an embodiment, a dielectric layer containing a hafnium tantalum titanium oxide layer may have a $t_{eq}$ of less than 5 Å. In an embodiment, a hafnium tantalum titanium oxide film may be formed with a thickness ranging from a monolayer to thousands of angstroms. Further, dielectric films of hafnium tantalum titanium oxide formed by atomic layer deposition may provide not only thin $t_{eq}$ films, but also films with relatively low leakage current. Additionally, embodiments may be implemented to form transistors, capacitors, memory devices, and other electronic systems including information handling devices.

Figure 2:
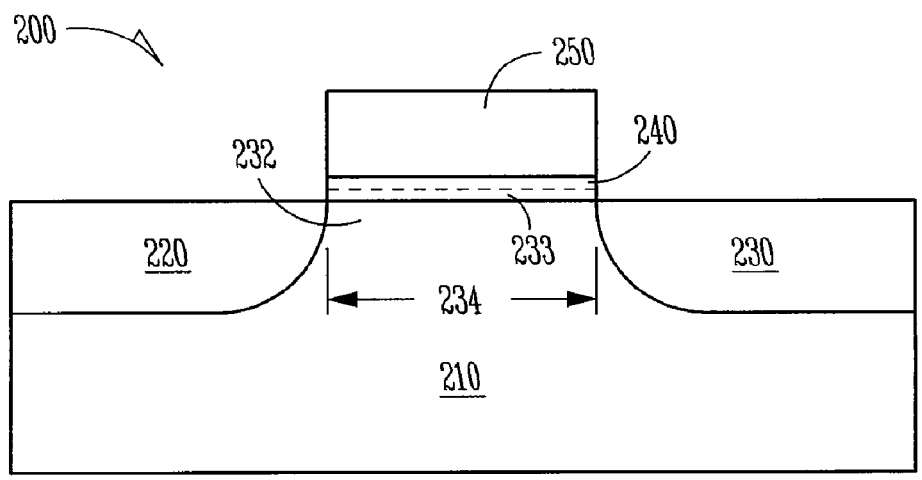
FIG. 2 shows an embodiment of a transistor having a dielectric layer containing a hafnium tantalum titanium oxide film.

FIG. 2 shows an embodiment of a transistor 200 having a dielectric layer 240 containing a $HfTaTiO_x$ film. Transistor 200 may include a source region 220 and a drain region 230 in a silicon-based substrate 210 where source and drain regions 220, 230 are separated by a body region 232. Body region 232 defines a channel having a channel length 234. A gate dielectric 240 may be disposed on substrate 210 with gate dielectric 240 formed as a dielectric layer containing $HfTaTiO_x$. Gate dielectric 240 may be realized as a dielectric layer formed substantially of $HfTaTiO_x$. Gate dielectric 240 may be constructed as multiple dielectric layers, that is, as a dielectric stack, containing at least one $HfTaTiO_x$ film and one or more layers of insulating material other than a hafnium tantalum titanium oxide film. The $HfTaTiO_x$ film may be structured as one or more monolayers. An embodiment of a $HfTaTiO_x$ film may be formed using atomic layer deposition. A gate 250 may be formed over and contact gate dielectric 240.

An interfacial layer 233 may form between body region 232 and gate dielectric 240. In an embodiment, interfacial layer 233 may be limited to a relatively small thickness compared to gate dielectric 240, or to a thickness significantly less than gate dielectric 240 as to be effectively eliminated. Forming the substrate and the source and drain regions may be performed using standard processes known to those skilled in the art. Additionally, the sequencing of the various elements of the process for forming a transistor may be conducted with fabrication processes known to those skilled in the art. In an embodiment, gate dielectric 240 may be realized as a gate insulator in a silicon complimentary metal oxide semiconductor (CMOS) transistor. Use of a gate dielectric containing hafnium tantalum titanium oxide is not limited to silicon based substrates, but may be used with a variety of semiconductor substrates.

Figure 3:
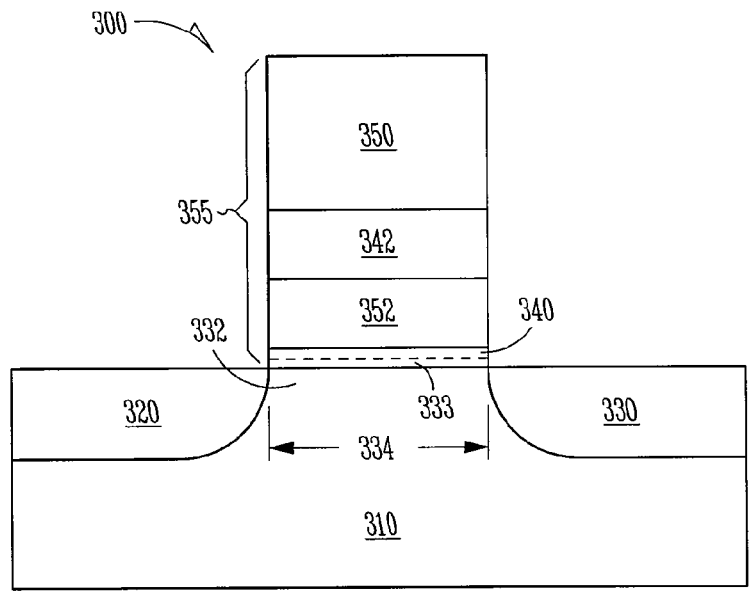
FIG. 3 shows an embodiment of a floating gate transistor having a dielectric layer containing a hafnium tantalum titanium oxide film.

FIG. 3 shows an embodiment of a floating gate transistor 300 having a dielectric layer containing a $HfTaTiO_x$ film. The $HfTaTiO_x$ film may be structured as one or more monolayers. The $HfTaTiO_x$ film may be formed using atomic layer deposition techniques. Transistor 300 may include a silicon-based substrate 310 with a source 320 and a drain 330 separated by a body region 332. Body region 332 between source 320 and drain 330 defines a channel region having a channel length 334. Located above body region 332 is a stack 355 including a gate dielectric 340, a floating gate 352, a floating gate dielectric 342, and a control gate 350. An interfacial layer 333 may form between body region 332 and gate dielectric 340. In an embodiment, interfacial layer 333 may be limited to a relatively small thickness compared to gate dielectric 340, or to a thickness significantly less than gate dielectric 340 as to be effectively eliminated.

In an embodiment, gate dielectric 340 includes a dielectric containing an atomic layer deposited $HfTaTiO_x$ film formed in embodiments similar to those described herein. Gate dielectric 340 may be realized as a dielectric layer formed substantially of $HfTaTiO_x$. Gate dielectric 340 may be a dielectric stack containing at least one $HfTaTiO_x$ film and one or more layers of other insulating materials. In an embodiment, floating gate 352 may be formed over and contact gate dielectric 340.

In an embodiment, floating gate dielectric 342 includes a dielectric containing a $HfTaTiO_x$ film. The $HfTaTiO_x$ film may be structured as one or more monolayers. In an embodiment, the $HfTaTiO_x$ may be formed using atomic layer deposition techniques. Floating gate dielectric 342 may be realized as a dielectric layer formed substantially of $HfTaTiO_x$. Floating gate dielectric 342 may be a dielectric stack containing at least one $HfTaTiO_x$ film and one or more layers of other insulating materials. In an embodiment, control gate 350 may be formed over and contact floating gate dielectric 342.

Alternatively, both gate dielectric 340 and floating gate dielectric 342 may be formed as dielectric layers containing a $HfTaTiO_x$ film structured as one or more monolayers. Gate dielectric 340 and floating gate dielectric 342 may be realized by embodiments similar to those described herein, with the remaining elements of the transistor 300 formed using processes known to those skilled in the art. In an embodiment, gate dielectric 340 forms a tunnel gate insulator and floating gate dielectric 342 forms an inter-gate insulator in flash memory devices, where gate dielectric 340 and floating gate dielectric 342 may include a hafnium tantalum titanium oxide film structured as one or more monolayers. Such structures are not limited to silicon based substrates, but may be used with a variety of semiconductor substrates.

Figure 4:
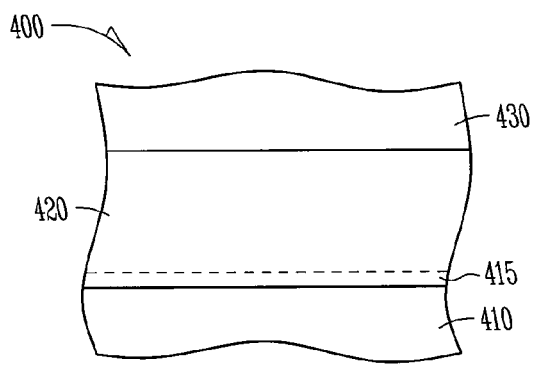
FIG. 4 shows an embodiment of a capacitor having a dielectric layer containing a hafnium tantalum titanium oxide film.

Embodiments of a hafnium tantalum titanium oxide film structured as one or more monolayers may also be applied to capacitors in various integrated circuits, memory devices, and electronic systems. In an embodiment for a capacitor 400 illustrated in FIG. 4, a method includes forming a first conductive layer 410, forming a dielectric layer 420 containing a hafnium tantalum titanium oxide film structured as one or more monolayers on first conductive layer 410, and forming a second conductive layer 430 on dielectric layer 420. Dielectric layer 420, containing a $HfTaTiO_x$ film, may be formed using various embodiments described herein. Dielectric layer 420 may be realized as a dielectric layer formed substantially of $HfTaTiO_x$. Dielectric layer 420 may be a dielectric stack containing at least one $HfTaTiO_x$ film and one or more layers of other insulating materials. An interfacial layer 415 may form between first conductive layer 410 and dielectric layer 420. In an embodiment, interfacial layer 415 may be limited to a relatively small thickness compared to dielectric layer 420, or to a thickness significantly less than dielectric layer 420 as to be effectively eliminated.

Embodiments for a hafnium tantalum titanium oxide film structured as one or more monolayers may include, but are not limited to, a capacitor in a DRAM and capacitors in analog, radio frequency (RF), and mixed signal integrated circuits. Mixed signal integrated circuits are integrated circuits that may operate with digital and analog signals.

Figure 5:
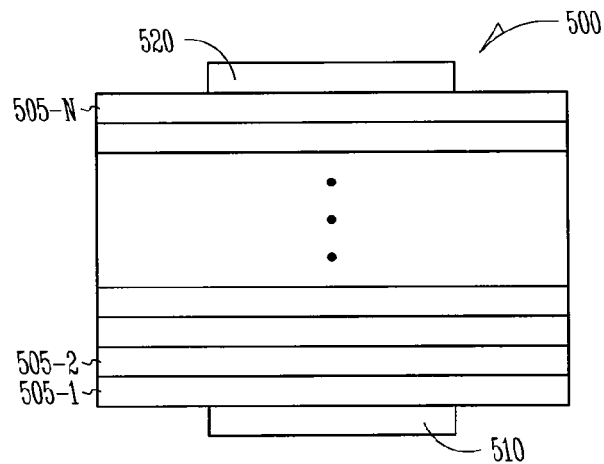
FIG. 5 depicts an embodiment of a dielectric layer having multiple layers including a hafnium tantalum titanium oxide layer.

FIG. 5 depicts an embodiment of a dielectric structure 500 having multiple dielectric layers 505-1, 505-2, . . . 505-N, in which at least one layer is a hafnium tantalum titanium oxide layer. Layers 510 and 520 may provide means to contact dielectric layers 505-1, 505-2, . . . 505-N. Layers 510 and 520 may be electrodes forming a capacitor. Layer 510 may be a body region of a transistor with layer 520 being a gate. Layer 510 may be a floating gate electrode with layer 520 being a control gate.

In an embodiment, dielectric structure 500 includes one or more layers 505-1, 505-2 . . . 505-N as dielectric layers other than a HfTaTiO layer, where at least one layer is a HfTaTiO layer. Dielectric layers 505-1, 505-2 . . . 505-N may include a $HfO_x$ layer, a $TaO_y$ layer, a $TiO_z$ layer, a HfTiO layer, a HfTaO layer, a TaTiO layer, or various combinations of these layers. Dielectric layers 505-1, 505-2 . . . 505-N may include an insulating metal oxide layer, whose metal is selected to be a metal different from hafnium, tantalum and titanium. Dielectric layers 505-1, 505-2, . . . 505-N may include an insulating nitride layer. Dielectric layers 505-1, 505-2, . . . 505-N may include an insulating oxynitride layer. Dielectric layers 505-1, 505-2, . . . 505-N may include a silicon nitride layer. Dielectric layers 505-1, 505-2, . . . 505-N may include an insulating silicate layer. Dielectric layers 505-1, 505-2, . . . 505-N may include a silicon oxide layer.

Various embodiments for a dielectric layer containing a hafnium tantalum titanium oxide film structured as one or more monolayers may provide for enhanced device performance by providing devices with reduced leakage current. Such improvements in leakage current characteristics may be attained by forming one or more layers of a hafnium tantalum titanium oxide in a nanolaminate structure with other metal oxides, non-metal-containing dielectrics, or combinations thereof. The transition from one layer of the nanolaminate to another layer of the nanolaminate provides disruption to a tendency for an ordered structure in the nanolaminate stack. The term "nanolaminate" means a composite film of ultra thin layers of two or more materials in a layered stack. Typically, each layer in a nanolaminate has a thickness of an order of magnitude in the nanometer range. Further, each individual material layer of the nanolaminate may have a thickness as low as a monolayer of the material or as high as 20 nanometers. In an embodiment, a $HfO_x$/HfTaTiO nanolaminate contains alternating layers of a hafnium oxide and HfTaTiO. In an embodiment, a $TaO_y$/HfTaTiO nanolaminate contains alternating layers of tantalum oxide and HfTaTiO. In an embodiment, a $TiO_z$/HfTaTiO nanolaminate contains alternating layers of titanium oxide and HfTaTiO. In an embodiment, a $HfO_x$/$TaO_y$/$TiO_z$/HfTaTiO nanolaminate contains various permutations of hafnium oxide layers, tantalum oxide layers, titanium oxide layers, and hafnium tantalum titanium oxide layers.

In an embodiment, dielectric structure 500 may be structured as a nanolaminate structure 500 including a HfTaTiO$_x$ film structured as one or more monolayers. Nanolaminate structure 500 includes a plurality of layers 505-1, 505-2 to 505-N, where at least one layer contains a HfTaTiO$_x$ film structured as one or more monolayers. The other layers may be insulating nitrides, insulating oxynitrides, and other dielectric materials such as insulating metal oxides. The sequencing of the layers depends on the application. The effective dielectric constant associated with nanolaminate structure 500 is that attributable to N capacitors in series, where each capacitor has a thickness defined by the thickness and composition of the corresponding layer. By selecting each thickness and the composition of each layer, a nanolaminate structure can be engineered to have a predetermined dielectric constant. Embodiments for structures such as nanolaminate structure 500 may be used as nanolaminate dielectrics in non-volatile read only memory (NROM) flash memory devices as well as other integrated circuits. In an embodiment, a layer of the nanolaminate structure 500 is used to store charge in a NROM device. The charge storage layer of a nanolaminate structure 500 in a NROM device may be a silicon oxide layer.

Transistors, capacitors, and other devices may include dielectric films containing a layer of a hafnium tantalum titanium oxide compound structured as one or more monolayers. The hafnium tantalum titanium oxide layer may be formed by atomic layer deposition. Dielectric films containing a hafnium tantalum titanium oxide layer may be implemented into memory devices and electronic systems including information handling devices. Further, embodiments of electronic devices and electronic apparatus may be realized as integrated circuits. Embodiments of information handling devices may include wireless systems, telecommunication systems, and computers.

Figure 6:
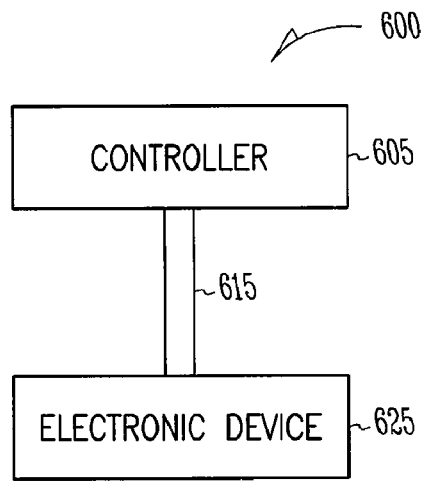
FIG. 6 is a simplified diagram for an embodiment of a controller coupled to an electronic device having a dielectric layer containing a hafnium tantalum titanium oxide film.

FIG. 6 illustrates a block diagram for an electronic system 600 having one or more devices having a dielectric structure including a HfTaTiO$_x$ film structured as one or more monolayers. Electronic system 600 includes a controller 605, a bus 615, and an electronic device 625, where bus 615 provides electrical conductivity between controller 605 and electronic device 625. In various embodiments, controller 605 may include an embodiment of a HfTaTiO$_x$ film. In various embodiments, electronic device 625 may include an embodiment of a HfTaTiO$_x$ film. In various embodiments, controller 605 and electronic device 625 may include embodiments of a HfTaTiO$_x$ film. Electronic system 600 may include, but is not limited to, fiber optic systems, electro-optic systems, and information handling systems such as wireless systems, telecommunication systems, and computers.

Figure 7:
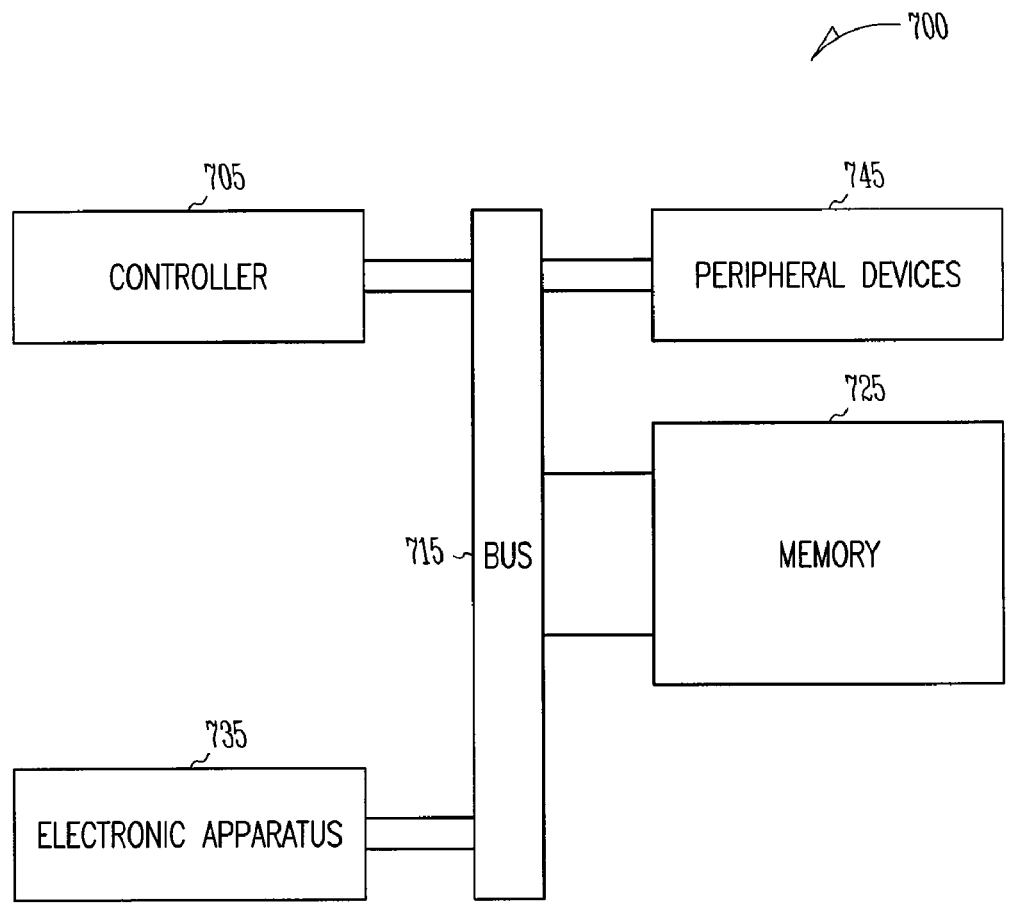
FIG. 7 illustrates a diagram for an embodiment of an electronic system having devices with a dielectric film containing a hafnium tantalum titanium oxide film.

FIG. 7 depicts a diagram of an embodiment of a system 700 having a controller 705 and a memory 725. Controller 705 may include a HfTaTiO$_x$ film structured as one or more monolayers. Memory 725 may include a HfTaTiO$_x$ film structured as one or more monolayers. Controller 705 and memory 725 may each include a HfTaTiO$_x$ film structured as one or more monolayers. System 700 also includes an electronic apparatus 735 and a bus 715, where bus 715 provides electrical conductivity between controller 705 and electronic apparatus 735, and between controller 705 and memory 725. Bus 715 may include an address bus, a data bus, and a control bus, each independently configured. Alternatively, bus 715 may use common conductive lines for providing one or more of address, data, or control, the use of which is regulated by controller 705. In an embodiment, electronic apparatus 735 may be additional memory configured in a manner similar to memory 725. An embodiment may include an additional peripheral device or devices 745 coupled to bus 715. In an embodiment, controller 705 is a processor. One or more of controller 705, memory 725, bus 715, electronic apparatus 735, or peripheral devices 745 may include an embodiment of a dielectric layer having a HfTaTiO$_x$ film structured as one or more monolayers System 700 may include, but is not limited to, information handling devices, telecommunication systems, and computers.

Peripheral devices 745 may include displays, additional storage memory, or other control devices that may operate in conjunction with controller 705. Alternatively, peripheral devices 745 may include displays, additional storage memory, or other control devices that may operate in conjunction with memory 725, or controller 705 and memory 725.

Memory 725 may be realized as a memory device containing a HfTaTiO$_x$ film structured as one or more monolayers. The HfTaTiO$_x$ structure may be formed in a memory cell of a memory array. The HfTaTiO$_x$ oxide structure may be formed in a capacitor in a memory cell of a memory array. The HfTaTiO$_x$ structure may be formed in a transistor in a memory cell of a memory array. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as other emerging DRAM technologies.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description.

What is claimed is:

1. An electronic device comprising:
a dielectric stack in an integrated circuit on a substrate, the dielectric stack including a hafnium tantalum titanium oxide, a hafnium oxide, a tantalum oxide, and a titanium oxide as separate entities, the integrated circuit being an electrically operable structure.

2. The electronic device of claim 1, wherein the dielectric stack includes a dielectric nitride.

3. The electronic device of claim 1, wherein the hafnium tantalum titanium oxide is doped with elements or compounds other than hafnium, tantalum, titanium, or oxygen.

4. The electronic device of claim 1, wherein the hafnium tantalum titanium oxide is doped with a metal other than hafnium, tantalum, or titanium.

5. The electronic device of claim 1, wherein the electronic device includes connections to couple a signal from other components in an electronic system to a conductive region contacting the dielectric stack.

6. An electronic device comprising:
a capacitor in an integrated circuit on a substrate, the capacitor having a dielectric stack, the dielectric stack including a hafnium tantalum titanium oxide, a hafnium oxide, a tantalum oxide, and a titanium oxide as separate entities, the integrated circuit being an electrically operable structure.

7. The electronic device of claim 6, wherein the dielectric stack includes a dielectric metal silicate or a dielectric lanthanide oxide.

8. The electronic device of claim 6, wherein the hafnium tantalum titanium oxide has a dielectric constant in the range from about 25 to about 80.

9. The electronic device of claim 6, wherein the capacitor is disposed in an analog circuit.

10. The electronic device of claim 6, wherein the capacitor is disposed in a radio frequency (RF) circuit.

11. A transistor comprising:
a source region and a drain region separated by a channel in an integrated circuit on a substrate;
a dielectric stack disposed above the channel in the integrated circuit, the dielectric stack including a hafnium tantalum titanium oxide, a hafnium oxide, a tantalum oxide, and a titanium oxide as separate entities, the integrated circuit being an electrically operable structure; and
a gate disposed above the dielectric.

12. The transistor of claim 11, wherein the dielectric stack is disposed as a tunnel oxide contacting the channel and a floating gate.

13. The transistor of claim 11, wherein the dielectric stack is disposed as a floating gate dielectric contacting a floating gate and a control gate.

14. The transistor of claim 11, wherein the dielectric stack includes an insulating metal oxide in addition to the hafnium tantalum titanium oxide, the hafnium oxide, the tantalum oxide, and the titanium oxide.

15. The transistor of claim 11, wherein the hafnium tantalum titanium oxide has an equivalent oxide thickness ranging from about ranging from about 5 Å to about 20 Å.

16. A memory comprising:
an array of memory cells in an integrated circuit on a substrate, each memory cell including a dielectric stack, the dielectric stack including a hafnium tantalum titanium oxide, a hafnium oxide, a tantalum oxide, and a titanium oxide as separate entities, the integrated circuit being an electrically operable structure.

17. The memory of claim 16, wherein each cell includes a capacitor to store charge representing data, the capacitor having the dielectric stack as a capacitor dielectric.

18. The memory of claim 16, wherein the each cell includes a transistor to store charge representing data, the transistor having the dielectric stack disposed as a tunnel oxide of the transistor.

19. The memory of claim 16, wherein the dielectric stack includes a nanolaminate containing the hafnium tantalum titanium oxide.

20. The transistor of claim 19, wherein the nanolaminate includes a silicon oxide layer as a charge storage layer in a NROM device.

21. An electronic device comprising:
a dielectric stack structured as a nanolaminate in an integrated circuit on a substrate, the nanolaminate including a hafnium tantalum titanium oxide, a hafnium oxide, a tantalum oxide, and a titanium oxide as separate entities, the integrated circuit being an electrically operable structure.

22. The electronic device of claim 21, wherein the nanolaminate includes an insulating metal oxide layer, the metal is selected to be a metal different from hafnium, tantalum and titanium.

23. The electronic device of claim 21, wherein the nanolaminate includes one or more layers of HfO, TaO, TiO, HfTiO, HfTaO, or TaTiO, each composition of varying stoichiometry.

24. The electronic device of claim 21, wherein the nanolaminate includes an insulating nitride layer.

25. The electronic device of claim 21, wherein the nanolaminate is disposed in a device coupled to a controller.

\* \* \* \* \*

UNITED STATES PATENT AND TRADEMARK OFFICE
CERTIFICATE OF CORRECTION

| | | |
|---|---|---|
| PATENT NO. | : 7,999,334 B2 | Page 1 of 1 |
| APPLICATION NO. | : 12/563596 | |
| DATED | : August 16, 2011 | |
| INVENTOR(S) | : Kie Y. Ahn et al. | |

It is certified that error appears in the above-identified patent and that said Letters Patent is hereby corrected as shown below:

In column 17, line 38, in Claim 15, after "about" delete "ranging from about".

In column 18, line 17, in Claim 20, delete "transistor" and insert -- memory --, therefor.

Signed and Sealed this
Twenty-second Day of November, 2011

David J. Kappos
*Director of the United States Patent and Trademark Office*